(12) United States Patent
Jung

(10) Patent No.: US 11,470,747 B2
(45) Date of Patent: Oct. 11, 2022

(54) CONVERTER

(71) Applicant: LG INNOTEK CO., LTD., Seoul (KR)

(72) Inventor: Yun Young Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/973,173

(22) PCT Filed: Apr. 18, 2019

(86) PCT No.: PCT/KR2019/004674
§ 371 (c)(1),
(2) Date: Dec. 8, 2020

(87) PCT Pub. No.: WO2019/245148
PCT Pub. Date: Dec. 26, 2019

(65) Prior Publication Data
US 2021/0259130 A1    Aug. 19, 2021

(30) Foreign Application Priority Data

Jun. 20, 2018 (KR) .......................... 10-2018-0070807
Jul. 18, 2018 (KR) .......................... 10-2018-0083463

(51) Int. Cl.
*H05K 7/20*  (2006.01)
*H05K 1/02*  (2006.01)
(Continued)

(52) U.S. Cl.
CPC ............ *H05K 7/209* (2013.01); *H02M 7/003* (2013.01); *H05K 1/0213* (2013.01); *H05K 5/0247* (2013.01); *H05K 7/1427* (2013.01); *H05K 7/20409* (2013.01); *H05K 7/20854* (2013.01); *H05K 2201/10272* (2013.01); *H05K 2201/10409* (2013.01)

(58) Field of Classification Search
None
See application file for complete search history.

(56) References Cited

U.S. PATENT DOCUMENTS 5,808,868 A * 9/1998 Drekmeier .............. H01L 23/16
165/80.2
8,730,675 B2 * 5/2014 Sano .................... H04M 1/0202
361/710
(Continued)

FOREIGN PATENT DOCUMENTS

JP   2006-287065 A   10/2006
JP   2007-28785 A    2/2007
(Continued)

*Primary Examiner* — Courtney L Smith
(74) *Attorney, Agent, or Firm* — Birch, Stewart, Kolasch & Birch, LLP

(57) ABSTRACT

This converter comprises: a housing having heat dissipation fins formed on the top surface thereof; a printed circuit board disposed in the inner space of the housing; and a bus bar, the bottom surface of which is in surface contact with the top surface of the printed circuit board, wherein the heat dissipation fins and the bus bar can be disposed overlapping each other in a vertical direction to enhance heat dissipation efficiency and can be further reduced in weight.

19 Claims, 9 Drawing Sheets

(51) Int. Cl.
　　　*H05K 7/14*　　　(2006.01)
　　　*H05K 5/02*　　　(2006.01)
　　　*H02M 7/00*　　　(2006.01)

(56) References Cited

U.S. PATENT DOCUMENTS

| | | | |
|---|---|---|---|
| 10,028,372 B2 * | 7/2018 | Ritter | H05K 7/20409 |
| 10,398,021 B2 * | 8/2019 | Avalos | B29C 45/0046 |
| 10,595,393 B2 * | 3/2020 | Sato | H03F 1/30 |
| 2003/0171039 A1 * | 9/2003 | Pierson, Jr. | H01R 9/22 |
| | | | 439/709 |
| 2006/0012034 A1 * | 1/2006 | Kadoya | H05K 7/20872 |
| | | | 257/712 |
| 2015/0101838 A1 * | 4/2015 | Shepard | H02G 5/06 |
| | | | 174/50 |
| 2019/0118735 A1 * | 4/2019 | Ota | H05K 7/20509 |
| 2019/0326738 A1 * | 10/2019 | Kita | H05K 1/02 |
| 2020/0194159 A1 * | 6/2020 | Tsuchida | H05K 7/06 |

FOREIGN PATENT DOCUMENTS

| | | |
|---|---|---|
| JP | 2007-215315 A | 8/2007 |
| JP | 2013-188105 A | 9/2013 |
| JP | 2013-211946 A | 10/2013 |

* cited by examiner

[FIG.1]
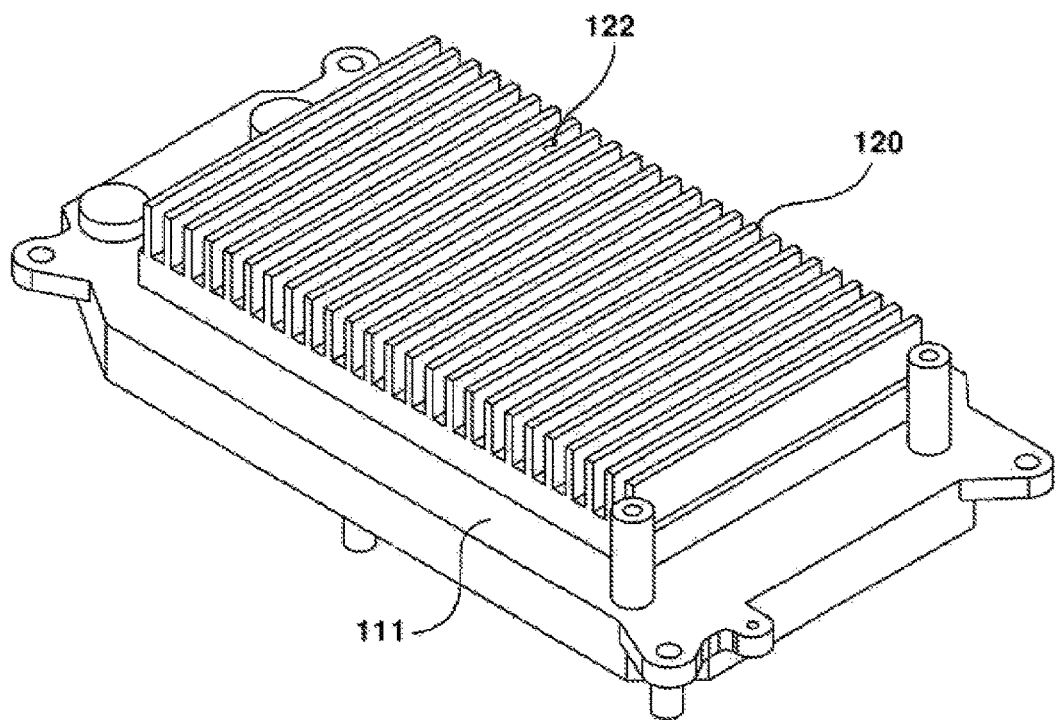

[FIG.2]
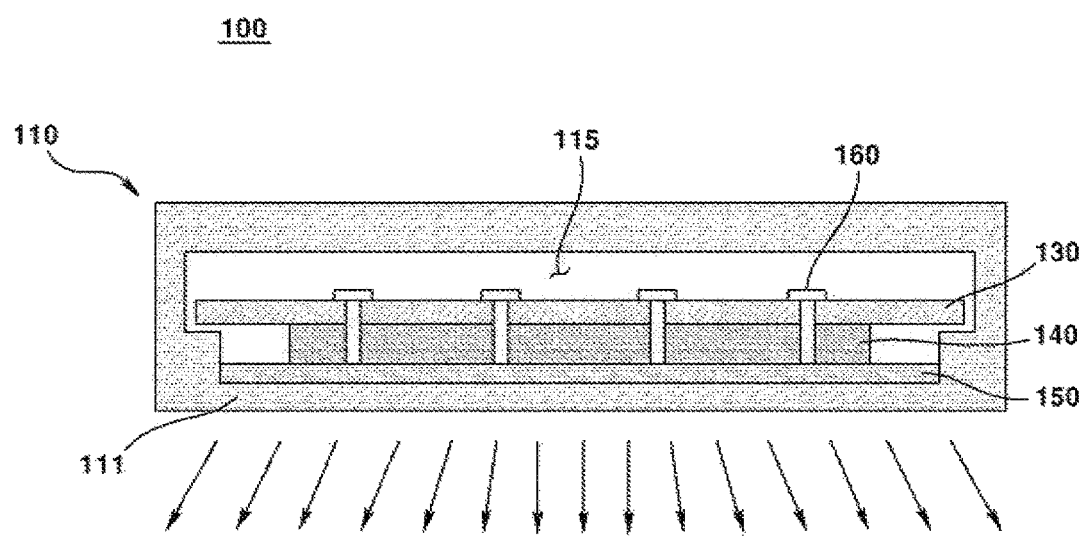

[FIG.3]
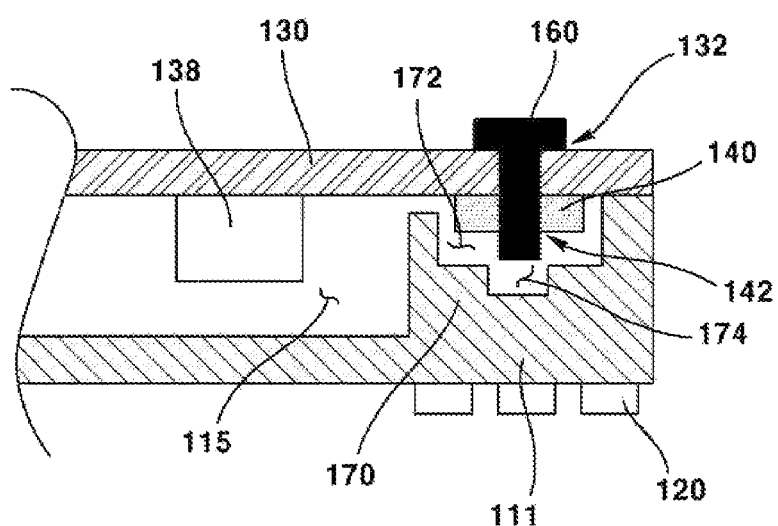

[FIG.4]
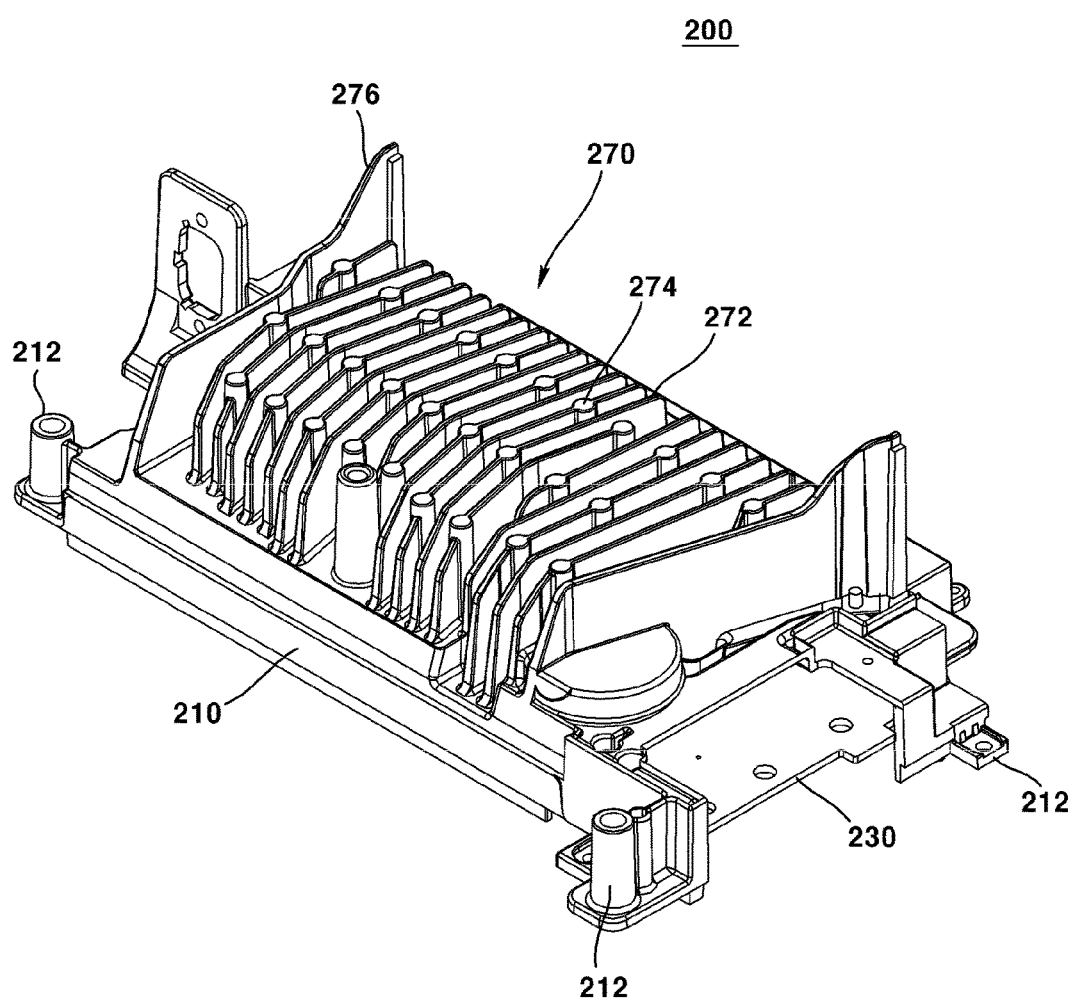

[FIG.5]
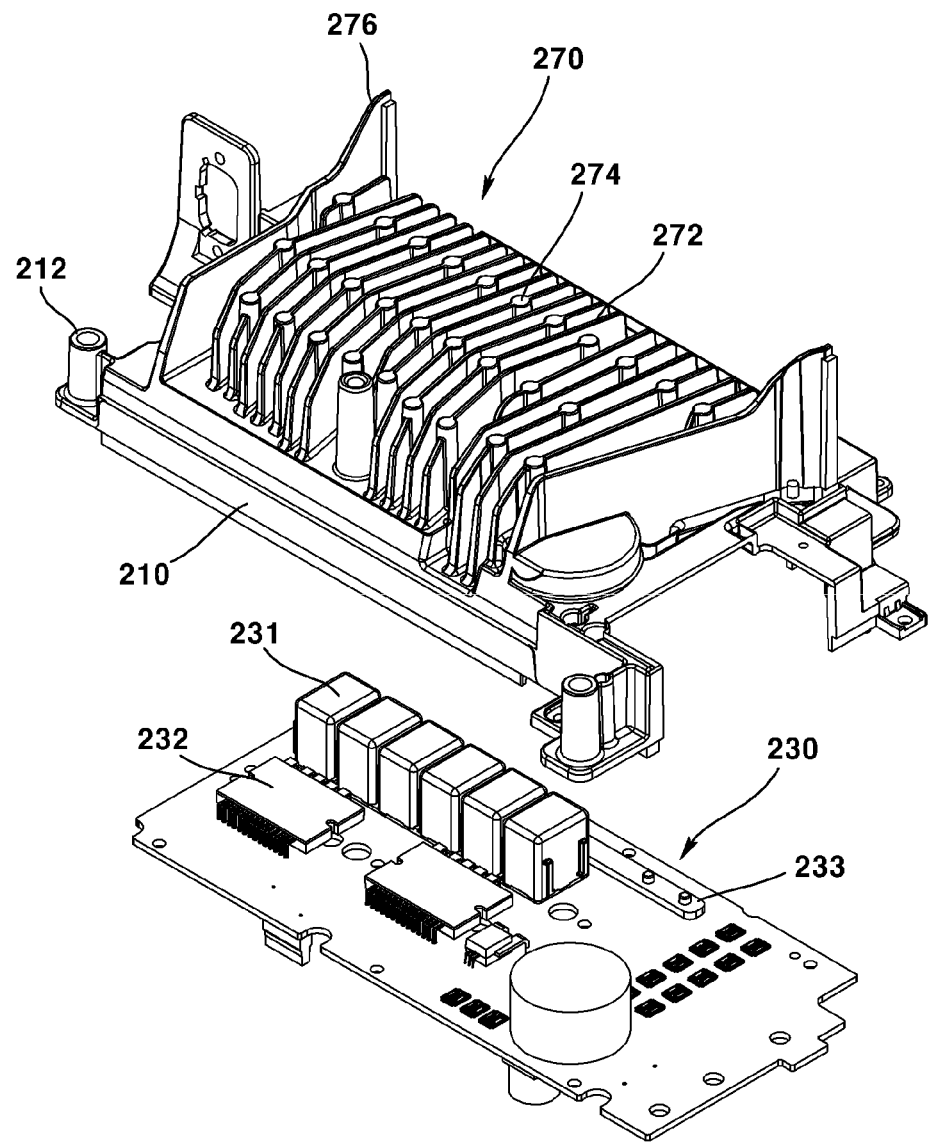

[FIG.6]
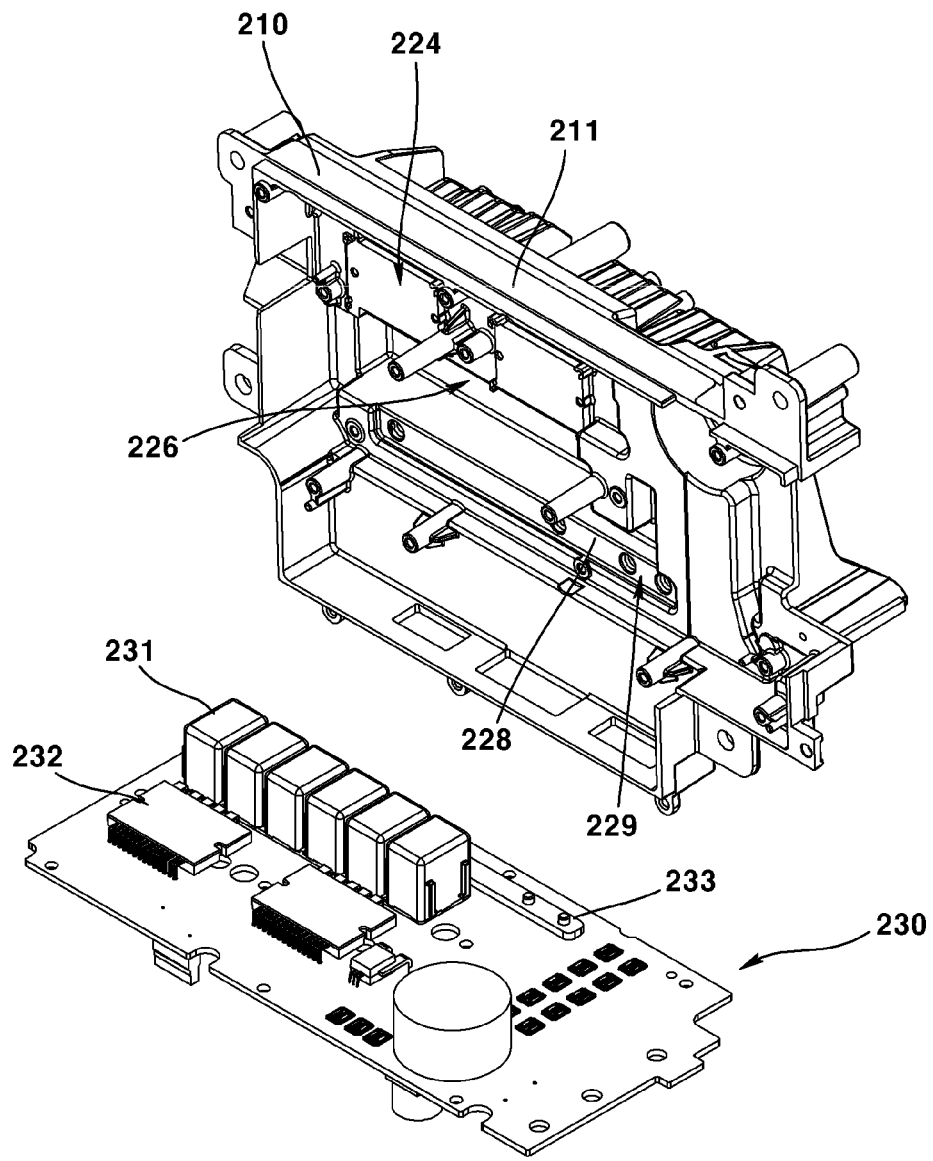

【FIG.7】
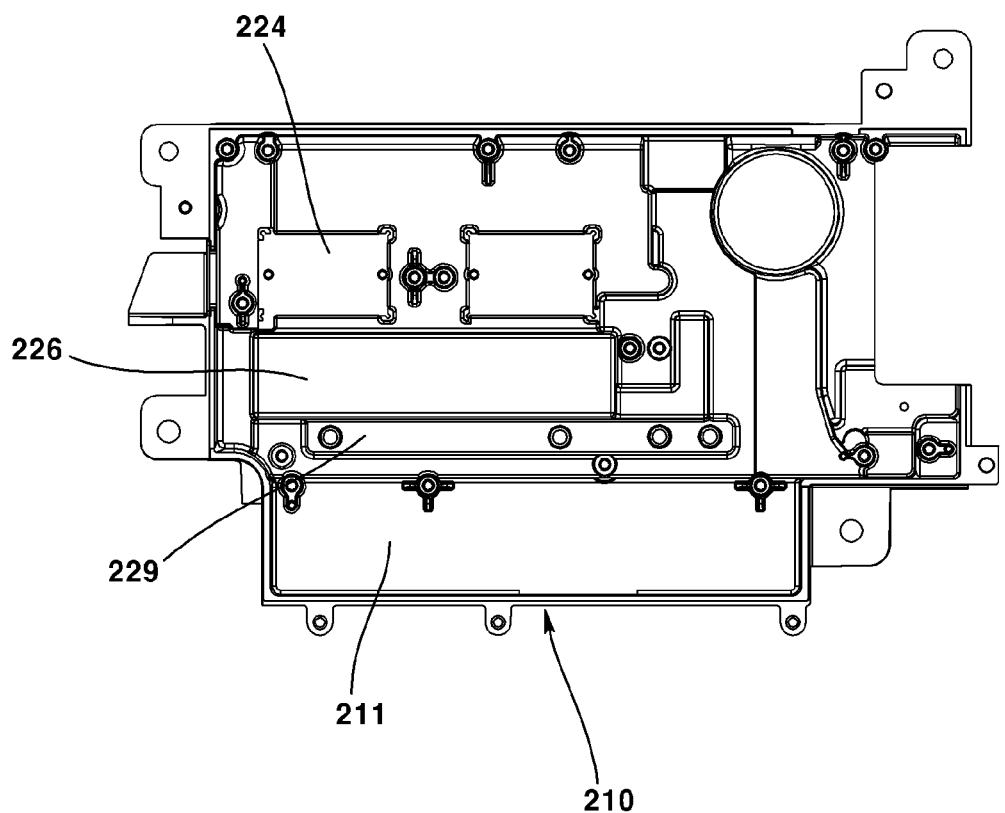

[FIG.8]
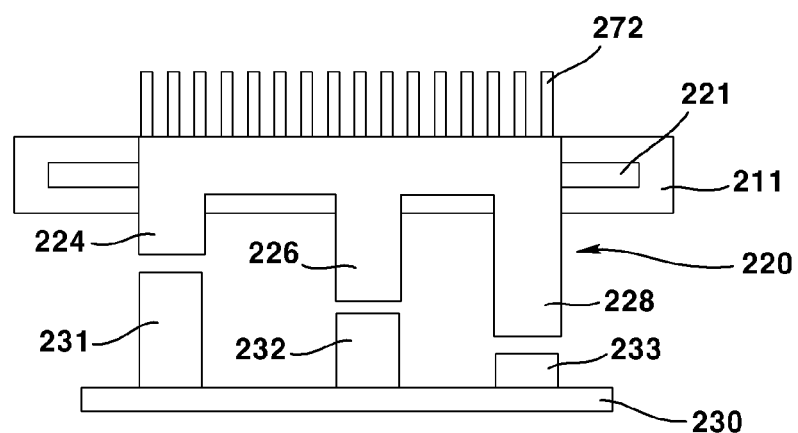

【FIG.9】
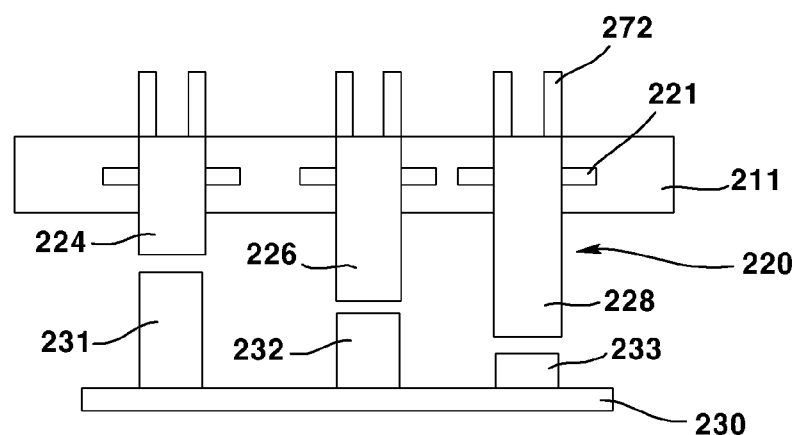

CONVERTER

CROSS REFERENCE TO RELATED APPLICATIONS

This application is the National Phase of PCT International Application No. PCT/KR2019/004674, filed on Apr. 18, 2019, which claims priority under 35 U.S.C. 119(a) to Patent Application Nos. 10-2018-0070807, filed in the Republic of Korea on Jun. 20, 2018 and 10-2018-0083463, filed in the Republic of Korea on Jul. 18, 2018, all of which are hereby expressly incorporated by reference into the present application.

TECHNICAL FIELD

The present invention relates to a converter.

TECHNICAL BACKGROUND

An electrical device of a vehicle generally includes an engine electrical device (starting device, ignition device, charging device) and an equalizing device, but recently, concomittent with a vehicle going into a more advanced electronic control system, the current norm is that most of the systems including chassis electric devices are heading for electro-electronization.

Various electronic units, including, but not limited thereto, lamps, audio systems, heaters, and airconditioners, receive a power from a battery while a vehicle is in a stationary state, and receive a power from a generator while in a running state, at which time, a generation capacity of 14V series power system is used as a common power voltage.

Recently, along with development of information technology industries, various new technologies (motorized power steering, internet, etc.) for enhancing conveniences of vehicles are applied to vehicles, and development of new technologies to maximally use the current vehicle systems is expected to continue in the future.

Regardless of software or hardware type, a HEV (Hybrid Electric Vehicle) is installed with a DC-DC converter (Low Voltage DC-DC Converter) for supply of an electronic load (12V). Furthermore, the DC-DC converter functioning as a generator (alternator) for a general gasoline vehicle supplies a 12 voltage for electronic loads by voltage-downing a high voltage of main battery (usually 144V or more high voltage battery).

The DC-DC Converter is an electronic circuit or electro-mechanical device that converts a source of DC (Direct Current) from one voltage level to another, and used in various areas including television sets and electronic parts of vehicles.

The converter is formed in its outer shape by a housing. Furthermore, a variety of electronic units may be disposed at an inner space of housing for driving. One of the electronic units may include a PCB (Printed Circuit Board) disposed at one surface or both surfaces thereof with elements.

The PCB may be coupled by a bus bar to allow a current to flow. The bus bar may be spaced apart at a predetermined distance from one surface of the PCB. The bus bar made of metal material allows a current to flow therein, whereby heat is generated therefrom in response to driving of a converter. Meantime, the inner space of housing may be disposed with a plurality of separate heating elements in addition to the bus bar, and as a result, the converter suffers from problems in that only the heat dissipation fins disposed at an outside of housing are insufficient to dissipate the heat generated therefrom.

DETAILED DESCRIPTION OF THE INVENTION

Technical Subject

An exemplary embodiment of the present invention is provided a converter that can enhance heat dissipation efficiency by improving the structure thereof and that can be further reduced in weight.

Technical Solution

In one exemplary embodiment of the present invention, there may be provided with a converter, comprising:
a housing having heat dissipation fins formed on the top surface thereof; a PCB (Printed Circuit Board) disposed in the inner space of the housing; and
a bus bar, the bottom surface of which is in surface contact with the top surface of the PCB, wherein
the heat dissipation fins and the bus bar can be disposed overlapping each other in a vertical direction.

Preferably, but not necessarily, the PCB may be formed with a first screw hole, and the bus bar vertically opposite to the first screw hole may be formed with a second screw hole, wherein a screw passes through the first and second screw holes.

Preferably, but not necessarily, a heat conductive layer may be formed between a top surface of the bus bar and an inner surface of housing.

Preferably, but not necessarily, an area opposite to the bus bar in an inner surface of housing may be formed with a protruder inwardly protruding from the inner surface of housing.

Preferably, but not necessarily, the protruder may be so disposed as to be vertically overlapped with the heat dissipation fins.

Preferably, but not necessarily, an inner surface of the protruder may be formed with a first groove more outwardly dented than other areas, and the first groove may be accommodated by at least a portion of the bus bar.

Preferably, but not necessarily, a floor surface of the first groove may be disposed with a second groove formed by being depressed from the floor surface, and a distal end of the bus bar may be disposed by being spaced apart from the floor surface of the second groove.

Preferably, but not necessarily, the bus bar may surface-contact an inner surface of the housing.

Preferably, but not necessarily, the bus bar may be a LV (Low Voltage) bus bar formed with a low voltage.

In another exemplary embodiment of the present invention, there may be provided a converter comprising:
a housing;
a PCB disposed inside of the housing;
one or more electric elements disposed on the PCB to generate a heat in response to driving; and
heat dissipation fins disposed at an outside of the housing; wherein
the housing may include a first body of plastic material, and a second body of metal material integrally formed with the first body so disposed as to be vertically overlapped with electric elements.

Advantageous Effect of Invention

The exemplary embodiments of the present invention have advantageous effect in that heat generated from a bus bar can be directly transmitted to heat dissipation fins through a housing to thereby enhance the dissipation efficiency.

Furthermore, the exemplary embodiments of the present invention have another advantageous effect in that an area opposite to electric elements in a housing may be formed with metal material, and remaining other areas are formed with plastic material to allow reducing an entire weight of housing as opposed to the conventional housing, thereby enabling a further reduction in weight of converter.

Still furthermore, the exemplary embodiments of the present invention have another advantageous effect in that a first body can be easily coupled in the insert injection due to a coupling part protruding from an outside of the second body.

BRIEF DESCRIPTION OF DRAWINGS

FIG. 1 is a perspective view of a converter according to an exemplary embodiment of the present invention.

FIG. 2 is a cross-sectional view of an inner structure of a converter according to an exemplary embodiment of the present invention.

FIG. 3 is a cross-sectional view illustrating an essential part of heat dissipation structure of a bus bar according to an exemplary embodiment of the present invention.

FIG. 4 is a perspective view of a converter according to an exemplary embodiment of the present invention.

FIG. 5 is an exploded perspective view of a converter according to an exemplary embodiment of the present invention.

FIG. 6 is a schematic view of a housing that is rotated at a predetermined angle in the exploded perspective view of FIG. 5.

FIG. 7 is a cross-sectional view illustrating a bottom surface of a housing according to an exemplary embodiment of the present invention.

FIG. 8 is a cross-sectional view briefly illustrating a layout structure of a housing and a PCB according to an exemplary embodiment of the present invention.

FIG. 9 is a cross-sectional view illustrating a modification of FIG. 8.

BEST MODE

Hereinafter, exemplary embodiments of the present invention will be described in detail with reference to the accompanying drawings.

However, the inventive concepts and ideas of the present invention are not limited to some of the exemplary embodiments to be explained but may be realized in various forms, and one or more elements may be selectively coupled and substituted thereamong as long as within the scope of the technical concepts of the present invention.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and/or the present application.

Furthermore, the terminology used herein is for the purpose of describing exemplary embodiments only and is not intended to be limiting. As used herein, the singular forms may be intended to include the plural forms as well, unless the context clearly indicates otherwise.

When described in any one of "A, B and C (or more than one)", one or more combinations combinable by all of A, B and C may be included. Furthermore, in describing elements of exemplary embodiments of the present invention, terms such as first, second, A, B, (a) and (b) may be used. These terms may be only used to distinguish one element from another element, and essence, order or sequence of relevant elements will not be limited by these terms.

Furthermore, when an element is referred to as being "on", "engaged to", "connected to" or "coupled to" another element, it may be interpreted as being directly on, engaged, connected or coupled to the other element, or intervening elements may be present therebetween.

Furthermore, when an element is referred to as being "on (above)" or "below (under)" another element, it may be directly on (above) or below (under) the other element, or one or more intervening elements may be present between two elements. Thus, the example term "on (above)" or "below (under)" can encompass both an orientation of above and below.

FIG. 1 is a perspective view of a converter according to an exemplary embodiment of the present invention, and FIG. 2 is a cross-sectional view of an inner structure of a converter according to an exemplary embodiment of the present invention.

A converter according to an exemplary embodiment of the present invention is an electronic unit installed on a vehicle, airconditioner and the like, and means an electronic circuit that converts a source from one voltage level to another. For example, a converter (100) may be a DC-DC converter. However, the structure according to the exemplary embodiment of the present invention is not limited thereto, and various electronic units including the foregoing type may be applied to the present invention.

Referring to FIGS. 1 and 2, the converter (100) according to an exemplary embodiment of the present invention may be formed in its exterior look by a housing (110). The housing (110) may take an oval shape in its cross-section and may be formed therein with a space part (115) disposed with various electronic units for driving.

The housing (110) may be disposed at an outside thereof with one or more heat dissipation fins (120). When a surface disposed with the heat dissipation fin (120) is called a top surface (111) of the housing (110), the heat dissipation fin (120) may take a shape upwardly protruding from the top surface (111). The heat dissipation fin (120) may be formed in a plural number. As a result, a gap (122) may be formed between adjacent heat dissipation fins (120). A cross-sectional outside surface of housing (110) may be increased by the heat dissipation fin (122) to thereby enhance the heat dissipation efficiency. Adjacent area of converter (100) may be separately disposed with a fan (not shown) for discharging an air toward the heat dissipation fin.

The space part (115) inside the housing (110) may be disposed with a PCB (Printed Circuit Board, 130) and a bus bar (140) coupled to one surface of the PCB (130).

The PCB (130) may take a plate shape, and may be formed at one surface or both surfaces with an element for operating the converter (100). Examples of parts mounted on the PCB (130) may include a transformer for voltage adjustment and an inductor for obtaining inductance.

The busbar (140) may be disposed on one surface of PCB (130), The heat dissipation fin (120) and the bus bar (140) may be so disposed as to be vertically overlapped. When a surface opposite to the top surface (111) of housing (110) disposed with the heat dissipation fin (120) may be called a top surface of PCB (130), the bus bar (140) may be disposed on a top surface of the PCB (130). The bus bar (140) may be surface-contacted at a bottom surface thereof by a top surface of PCB (130). That is, a bottom surface of bus bar (140) and a top surface of PCB (130) may be parallel disposed to vertically surface-contact each other.

The bus bar (140) is purported to flow a current among parts disposed inside of the PCB (130), and may be a LV (Low Voltage) bus bar formed therein with a low voltage. The bus bar (140) may be formed with a metal material. For example, the material of bus bar (140) may be brass. An area spaced apart from the bus bar (14) on the top surface of PCB (130) may be additionally disposed with a separate element (138).

The bus bar (140) may be screw-connected with the PCB (130) using a screw (160). The PCB (130) may be formed with a first screw hole (132, see FIG. 3). Furthermore, the bus bar (140) opposite to the first screw hole (132) may be formed with a second screw hole (142). A screw groove may be formed at an inner surface of the first screw hole (132) and the second screw hole (142). Furthermore, a screw thread may be formed at an outside surface of the screw (160) coupled to the first screw hole (132) and the second screw hole. Thus, the bus bar (140) and the PCB (130) may be coupled by screw-connection of the screw (160) to the first screw hole (132) and the second screw hole (142).

The screw (160) may be formed in a plural number, each spaced apart from the other to couple the bus bar (140) to the PCB (130). In addition, a portion of a lower distal end of the screw (160) may be downwardly protruded at a predetermined distance from a bottom surface of bus bar (140).

Heat may be generated because current flows in the bus bar (140) in response to the driving of converter (100). As a result, the heat generated from the bus bar (140) may be efficiently dissipated by allowing the bus barf (140) to surface-contact the top surface of PCB (139) facing the heat dissipation fin (120) according to an exemplary embodiment of the present invention. That is, when an area formed with the heat dissipation fin (120) is called an upper plate of the housing (110), the bus bar (140) may be so disposed as to be adjacently disposed on an inner surface of the upper plate. As a result, the heat generated from the bus bar (140) may be directly transmitted to the heat dissipation fin (120) to allow the heat to be dissipated.

Meantime, a heat conductive layer (150) may be formed between an inner surface of housing (110) and the bus bar (140). The heat conductive layer (150) may be a layer coated with heat conductive materials. Therefore, a bottom surface of the heat conductive layer (150) may be brought into contact with the top surface of bus bar (140), and the top surface of the heat conductive layer (150) may be brought into contact with an inner surface of upper plate formed with the heat dissipation fin (120) to allow the heat generated from the bus bar (140) to be efficiently transmitted to the heat dissipation fin (120).

However, unlike the aforementioned configuration, an outside of bus bar (140) may be so disposed as to allow directly contacting an inner surface of housing (110). In this case, the heat generated from the bus bar (140) may be directly transmitted to the heat dissipation fin (120) through the housing (110).

FIG. 3 is a cross-sectional view illustrating an essential part of heat dissipation structure of a bus bar according to an exemplary embodiment of the present invention.

FIG. 2 is a conceptual diagram to allow easily understand a heat dissipation structure of bus bar according to an exemplary embodiment of the present invention, and when applying the structure to the converter, the heat dissipation structure may be formed as shown in FIG. 3. That is, in case the size of bus bar is formed to be relatively smaller than that of the PCB, the heat dissipation structure may be formed as shown in FIG. 3. However, in case the size of bus bar is formed to be relatively greater than that of the PCB to thereby correspond to the PCB sizewise, the heat dissipation structure may be formed as shown in FIG. 2. Therefore, it should be appreciated that FIGS. 2 and 3 are illustrated not to distinguish the concepts of the present exemplary embodiments but to illustrate various applicable examples.

Referring FIG. 3, an inner surface of the housing (110) facing the bus bar (140) may be formed with an inwardly protruding protruder (170). Furthermore, an outside of the housing (110) facing a formed area of the protruder (170) may be disposed with the heat dissipation fin (120). That is, the protruder (170) may be so disposed as to be vertically overlapped with the heat dissipation fin (120).

Meantime, a surface facing the bus bar (140) on the protruder (170) may be formed with a first groove (172) that is more outwardly dented than the other area. A cross-section of the first groove (172) may correspond to or may be greater than that of the bus bar (140) to allow accommodating at least a portion of the bus bar (140) at an inner side thereof. Furthermore, the said heat conductive layer (150) may be formed between a floor surface of the first groove (172) and the bus bar (140).

Thus, the heat may be efficiently transmitted to the heat dissipation fin (120) by allowing the protruder (170) to be disposed at an inner surface of the formed area of heat dissipation fin (120) and to face the bus bar (140). That is, by preventing the heat generated from the bus bar (140) from moving to other areas inside the housing (110), the heat may be directly transmitted to the heat dissipation fin (120) through the protruder (170) to thereby enhance the heat dissipation efficiency.

Meantime, current flows in the bus bar (140) by being formed with a constant voltage, as explained herebefore, and therefore, the bus bar (140) must be prevented from being generated with short-circuit with other elements. Thus, in the exemplary embodiment, a second groove (174) more dented from a floor surface than other area is formed on the floor surface of the first groove (172) to prevent a distal end of the screw (160) from being brought into contact with an inner surface of housing (110). That is, because the housing (110) is formed with a ground voltage, the distal end of the screw (160) may be spaced apart from the inner surface of housing (110) through the second groove (174) to thereby prevent from being contacted with the screw (160). In other words, the distal end of screw (160) is spaced apart from a floor surface of the second groove (174).

Hereinafter, a converter will be explained according to a second exemplary embodiment of the present invention.

FIG. 4 is a perspective view of a converter according to an exemplary embodiment of the present invention.

Referring to FIG. 4, a converter (200) according to a second exemplary embodiment of the present invention may be formed in its exterior look by a housing (210). The housing (210) may be largely formed in its cross-section with an oval shape and may form a space for accommodating one or more parts therein.

The housing (210) may form a top surface of converter (200). The top surface of housing (210) may form a top surface of converter (200). A bottom surface of housing (210) may be coupled by a separate base (not shown). Therefore, an inner space of housing (210) may be blocked from outside by coupling of the base and the housing (210).

The housing (210) may be disposed with one or more coupling parts (212) for being coupled with the base. The coupling part (212) may be formed in a plural number around the housing (210). The coupling part (212) may be formed with a hole to allow a screw to pass therethrough. Furthermore, the base may be also formed with a hole to allow vertically facing the said hole. As a result, the screw can pass through the said holes to couple the housing (210) and the base.

The housing (210) may be formed thereon with a heat dissipation structure (270). The heat dissipation structure (270) may include a heat dissipation plate (272) upwardly protruding from a top surface of housing (210). The heat dissipation plate (272) may take a shape of a plate. The heat dissipation plate (272) may be formed in a plural number to be mutually spaced apart from a top surface of housing. That is, a gap may be formed between the plurality of heat dissipation plates (272). The heat dissipation plates (272) may increase a cross-section of an outside of the housing (210) to allow the heat generated from inside of the housing (210) to be easily dissipated to outside. Toward this end, an area adjacent to the converter (200) may be disposed with a fan (not shown) to discharge the air toward the heat dissipation plate (272).

The heat dissipation plate (272) may be disposed with a heat dissipation plate support (274). The heat dissipation plate support (274) may be upwardly protruded from a top surface of housing (210) to be disposed at one area of the heat dissipation plate (272). The heat dissipation plate support (274) may be an area formed with a more thickness than that of the heat dissipation plate (272). Thus, the heat dissipation plate support (274) may reinforce the strength of the heat dissipation plate (272). One heat dissipation plate (272) may be partitioned into mutually different areas by the heat dissipation plate support (274). The heat dissipation plate support (274) may be integrally formed with the heat dissipation plate (272).

The heat dissipation structure (270) may be partitioned by a partition part (276). The partition part (276) may be disposed at one marginal area on a top surface of housing (210) and at the other marginal area facing the said one marginal area in a plural number. A protruding height of the partition part (276) from a top surface of housing (210) may be formed higher than that of the heat dissipation plate (272). An area formed with the plurality of heat dissipation plate (272) may be partitioned from the other area by the partition part (276).

FIG. 5 is an exploded perspective view of a converter according to an exemplary embodiment of the present invention.

Referring to FIGS. 4 and 5, a PCB (230) may be disposed at a bottom surface of housing (210). The PCB (230) may be interpreted as being disposed at a space formed inside the housing (210).

The PCB (230) may be mounted or coupled with one or more electronic units for driving the converter (200). Examples of electronic units may include an inductor for obtaining inductance and a transformer for voltage adjustment. Additionally, a light emitting module displayed out of the housing (210) may be also included through lighting of a separate light emitting element.

In sum, the PCB (230) may be disposed with a first electric element (231), a second electric element (232) and a third electric element (233). The first to third electric elements (231, 232, 233) may generate heat in response to operation of converter (200). The first to third electric elements (231, 232, 233) may be disposed from one surface of the PCB (230), each mutually spaced apart. When the first to third electric elements (231, 232, 233) are disposed at a top surface of PCB (230), each height of the first to third electric elements (231, 232, 233) may be formed to be mutually different. That is, a distance from a top surface of PCB (230) to a top surface of each electric element may be mutually different. For example, the height of the first electric element (231) is the highest and the height of the second electric element (232) may be lowest.

The first to third electric elements (231, 232, 233) may be so disposed as to be vertically overlapped with the heat dissipation structure (270) disposed at a top surface of housing (210).

FIG. 6 is a schematic view of a housing that is rotated at a predetermined angle in the exploded perspective view of FIG. 5, FIG. 7 is a cross-sectional view illustrating a bottom surface of a housing according to an exemplary embodiment of the present invention, and FIG. 8 is a cross-sectional view briefly illustrating a layout structure of a housing and a PCB according to an exemplary embodiment of the present invention.

Referring to FIGS. 6, 7 and 8, the housing (210) according to the second exemplary embodiment of the present invention may be formed with two or more materials. The housing (210) may include a first body (211) of plastic material and a second body (220) of metal material. For example, the material of second body (220) may be aluminum (Al).

To be more specific, the second body (220) may be so formed with a metal material as to be vertically overlapped with the first to third electric elements (231, 232, 233). In some cases, an upper surface of the first to third electric elements (231, 232, 233) may be brought into contact with a bottom surface of second body (220). This may be also explained that the upper surface of the first to third electric elements (231, 232, 233) may be brought into contact with an inner surface of housing (210).

The first body (211) may be understood as being an area excluding the second body (220) in the housing (210). That is, an area not vertically overlapped with the first to third electric elements (231, 232, 233) in the area of housing (210) may be formed with plastic material.

The first body (211) and the second body (220) may be formed by double injection. For example, the first body (211) may be formed on the second body (220) by insert injection process. Therefore, the housing (210) may be formed through junction (combination) of a metal area and a non-metal area.

The housing (210) may be more inwardly protruded from an inner surface thereof than the other area to thereby have a plurality of areas vertically overlapped with the first to third electric elements.

The second body (220) may include a first area (226) vertically overlapped with the first electric element (231), a second area (224) vertically overlapped with the second electric element (232) and a third area (228) vertically overlapped with the third electric element (233).

Protruding heights from a bottom surface of housing (210) to a downward direction of the first to third areas (226, 224, 228) may be mutually different. That is, when the first area (226) has a first height, the second area (224) has a second height and the third area (228) has a third height in response to the heights of the first to third electric elements (231, 232, 233), the first height may be formed to be higher than the second height, and the third height may be formed to be higher than the second height. Thus, the heat dissipation structure of housing (210) may be embodied in consideration of each height of the plurality of electric elements.

Meanwhile, when the third electric element (233) is a light emitting module formed with a light emitting element, the third area (228) may be formed with a hole (229) for exposing the light emitting element to outside.

Referring to FIG. 5, the second body (220) may be integrally formed with the first body (211) of plastic material through insert injection as explained before. At this time, in order to easily couple the first body (211) of plastic material to the second body (220), the second body (220) may be formed with a coupling part (221).

To be more specific, when a top surface of second body (220) is formed with the heat dissipation plate (272), and a bottom surface of second body (220) is formed with mutually different plural first to third areas (226, 224, 228) of mutually different heights, the coupling part (221) may be so formed as to be protrusively and outwardly disposed from a lateral surface of second body (221). In other words, the coupling part (221) may be so formed as to be protruded from a surface coupled by the first area (211) on the outside of the second body (220). Therefore, the second body (220) may be increased in surface area by the coupling part (221) in the course of insert injection process to allow being easily coupled by the first body (211).

FIG. 9 is a cross-sectional view illustrating a modification of FIG. 8.

Referring to FIG. 9, in a modification, the said first to third areas (226, 224, 228) may be defined as respectively separate areas. That is, although the first to third areas (226, 224, 228) are integrally formed to allow the first body (211) to be coupled to a lateral surface of the second body (220) in the previous example, the modification may provide that the first to third areas (226, 224, 228) may be mutually spaced apart, and the second body (220) of plastic material may be respectively disposed among the discrete space.

As a result, in order to perform an easy coupling of second body (220), the coupling part (221) may be respectively protruded to an outside from lateral surfaces of first area (226), the second area (224) and the third area (228).

According to the foregoing structures, the exemplary embodiments of the present invention have advantageous effect in that an area opposite to electric elements in a housing is formed with metal material, and remaining other areas are formed with plastic material to allow reducing an entire weight of housing as opposed to the conventional housing, thereby enabling a further reduction in weight of converter.

Furthermore, the exemplary embodiments of the present invention have another advantageous effect in that a first body can be easily coupled in the insert injection due to a coupling part protruding from an outside of the second body.

It will be understood that, although the foregoing explanation has described one or more elements forming the exemplary embodiments of the present invention are coupled as one or operate as being combined or coupled, the present invention is not restricted to the given exemplary embodiments. That is, all the elements may operate as being selectively combined or coupled to one or more elements as long as within the scope of the purpose of the present invention.

It will be further understood that the terms "comprises" and/or "comprising,", "includes" and/or "including" when used in this specification, specify the presence of stated elements, but do not preclude the presence or addition of one or more other elements, unless expressed otherwise.

Unless otherwise defined, all terms including technical and scientific terms used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein. It should be understood that the abovementioned description is simply exemplary of the technical ideas of the present invention, and numerous other modifications can be devised by those skilled in the art that will not deviate from the aforementioned essential characteristics of the technical fields related to the principles of this invention. Therefore, it should be understood that the above-described embodiments are not limited by any of the details of the foregoing description and drawings, but defined by appended claims, and it should be interpreted that all the differences within the equivalent scopes thereof are included in the present disclosure.

The invention claimed is:

1. A converter, comprising:
   a housing including heat dissipation fins formed on a top surface of the housing;
   a printed circuit board (PCB) disposed in an inner space of the housing; and
   a bus bar having a bottom surface that is in surface contact with a top surface of the PCB,
   wherein the heat dissipation fins and the bus bar can be disposed overlapping each other in a vertical direction,
   wherein an area below the bus bar in an inner surface of housing is formed with a protruder inwardly protruding from the inner surface of housing, and
   wherein a groove is disposed on the inner surface of the protruder.

2. The converter of claim 1, wherein the PCB is formed with a first screw hole, and the bus bar vertically opposite to the first screw hole is formed with a second screw hole, wherein a screw passes through the first and second screw holes.

3. The converter of claim 1, wherein a heat conductive layer is formed between a top surface of the bus bar and the inner surface of the housing.

4. The converter of claim 3, wherein the heat conductive layer includes a heat transfer material,
   wherein an upper surface of the heat conductive layer is in contact with one surface of the bus bar, and
   wherein a lower surface of the heat conductive layer is in contact with the inner surface of the housing.

5. The converter of claim 1, wherein the protruder is so disposed as to be vertically overlapped with the heat dissipation fins.

6. The converter of claim 1, wherein the groove includes a first groove accommodating at least a portion of the bus bar.

7. The converter of claim 6, wherein the groove further includes a second groove recessed from a bottom surface of the first groove, and a distal end of the bus bar is spaced apart from a floor surface of the second groove.

8. The converter of claim 1, wherein the bus bar surface-contacts an inner surface of the housing.

9. The converter of claim 1, wherein the bus bar is a low voltage (LV) bus bar configured to distribute an electronic load of 12V.

10. The converter of claim 7, wherein a cross-sectional area of the second groove is smaller than a cross-sectional area of the first groove.

11. The converter of claim 7, wherein a screw connects the PCB to the busbar, and wherein the screw and the second groove overlap in the vertical direction.

12. The converter of claim 7, wherein a cross-sectional area of the busbar is larger than a cross-sectional area of the second groove.

13. The converter of claim 11, wherein the screw passes through the bus bar and protrudes upward from the bus bar.

14. The converter of claim 6, wherein a cross-sectional area of the first groove is larger than a cross-sectional area of the bus bar.

15. A converter, comprising:
a housing;
a printed circuit board (PCB) disposed inside of the housing;
one or more electric elements disposed on the PCB to generate a heat in response to operation of the converter; and
heat dissipation fins disposed at an outside of the housing;
wherein the housing includes a first body of plastic material, and a second body of metal material integrally formed with the first body, the second body disposed between the first body and the one or more electric elements, and
wherein the first body and the second body are integrally formed by insert injection.

16. The converter of claim 15, wherein the one or more electric elements is provided in plural, and
wherein the plurality of electric elements include:
a first electric element having a first height;
a second electric element spaced apart from the first electric element and having a second height lower than the first height; and
a third electric element spaced apart from the first and second electric elements and having a third height lower than the second height.

17. The converter of claim 16, wherein the housing includes a plurality of areas protruding from an inner surface of the housing and overlapping the one or more electric elements in a vertical direction.

18. The converter of claim 17, wherein the plurality of areas include:
a first area having a fourth height and facing the first electric element;
a second area facing the second electric element and having a fifth height higher than the fourth height; and
a third area facing the third electric element and having a sixth height higher than the fifth height.

19. The converter of claim 15, further comprising a coupling part protruding outward from an outer surface of the second body and disposed on a surface of the second body to which the first body is coupled.

* * * * *